United States Patent
Niwa et al.

(10) Patent No.: US 12,336,341 B2
(45) Date of Patent: Jun. 17, 2025

(54) SEMICONDUCTOR LIGHT-EMITTING ELEMENT AND METHOD OF MANUFACTURING SEMICONDUCTOR LIGHT-EMITTING ELEMENT

(71) Applicant: NIKKISO CO., LTD., Tokyo (JP)

(72) Inventors: Noritaka Niwa, Ishikawa (JP); Tetsuhiko Inazu, Ishikawa (JP); Haruhisa Aida, Ishikawa (JP)

(73) Assignee: NIKKISO CO., LTD., Tokyo (JP)

( * ) Notice: Subject to any disclaimer, the term of this patent is extended or adjusted under 35 U.S.C. 154(b) by 515 days.

(21) Appl. No.: 17/876,197

(22) Filed: Jul. 28, 2022

(65) Prior Publication Data

US 2023/0029549 A1 Feb. 2, 2023

(30) Foreign Application Priority Data

Jul. 30, 2021 (JP) ................. 2021-126105

(51) Int. Cl.
*H10H 20/841* (2025.01)
*H10H 20/01* (2025.01)
(Continued)

(52) U.S. Cl.
CPC .... *H10H 20/841* (2025.01); *H10H 20/01335* (2025.01); *H10H 20/032* (2025.01);
(Continued)

(58) Field of Classification Search
CPC .......... H10H 20/841; H10H 20/01335; H10H 20/034; H10H 20/825; H10H 29/8421;
(Continued)

(56) References Cited

U.S. PATENT DOCUMENTS

2013/0146907 A1* 6/2013 Lunev ................ H10H 20/8316
257/749
2015/0008389 A1* 1/2015 Hu ........................ H10H 20/856
438/34

(Continued)

FOREIGN PATENT DOCUMENTS

JP 2018142687 A 9/2018
JP 2019079982 A 5/2019
(Continued)

OTHER PUBLICATIONS

An Office Action in corresponding TW Application No. 111127490 dated Mar. 28, 2023 is attached, 6 pages.

*Primary Examiner* — Bryan R Junge
*Assistant Examiner* — Gary Abel
(74) *Attorney, Agent, or Firm* — MUNCY, GEISSLER, OLDS & LOWE, P.C.

(57) ABSTRACT

A semiconductor light-emitting element includes: an n-type semiconductor layer made of an n-type AlGaN-based semiconductor material; an active layer provided on the n-type semiconductor layer and made of an AlGaN-based semiconductor material; a p-type semiconductor layer provided on the active layer; a p-side contact electrode that includes a Rh layer in contact with an upper surface of the p-type semiconductor layer; a p-side electrode covering layer that is in contact with an upper surface and a side surface of the p-side contact electrode and includes a Ti layer, a Rh layer, and a TiN layer stacked successively; a dielectric covering layer that has a connection opening provided on the p-side electrode covering layer and covers the p-side electrode covering layer in a portion different from the connection opening; and a p-side current diffusion layer that connects to the p-side electrode covering layer in the connection opening.

6 Claims, 6 Drawing Sheets

(51) Int. Cl.
*H10H 20/825* (2025.01)
*H10H 20/832* (2025.01)

(52) U.S. Cl.
CPC ......... *H10H 20/832* (2025.01); *H10H 20/034* (2025.01); *H10H 20/825* (2025.01)

(58) Field of Classification Search
CPC .... H10H 20/01; H10H 20/036; H10H 29/036; H10H 20/032; H10H 20/32; H10H 20/8316–835; F27D 17/30; H10F 77/939; H10F 30/24; A61K 40/4214; G06F 11/3698; H02K 15/0273; H10D 30/0415
See application file for complete search history.

(56) References Cited

U.S. PATENT DOCUMENTS

| | | | | |
|---|---|---|---|---|
| 2018/0286915 A1* | 10/2018 | Yeon | .................... | H10H 20/831 |
| 2019/0006470 A1* | 1/2019 | Cheng | .................... | H01L 29/872 |
| 2021/0159378 A1* | 5/2021 | Lee | .................... | H10H 20/8506 |
| 2024/0304757 A1* | 9/2024 | Fan | ........................ | H10F 30/21 |

FOREIGN PATENT DOCUMENTS

| | | | | |
|---|---|---|---|---|
| JP | 6839320 B | 3/2021 | | |
| JP | 6867536 B1 * | 4/2021 | ......... | H01L 33/0075 |
| JP | 2021072376 A | 5/2021 | | |
| WO | WO2010125810 A1 | 11/2010 | | |
| WO | WO2014068965 A1 | 5/2014 | | |

* cited by examiner

SEMICONDUCTOR LIGHT-EMITTING ELEMENT AND METHOD OF MANUFACTURING SEMICONDUCTOR LIGHT-EMITTING ELEMENT

RELATED APPLICATION

Priority is claimed to Japanese Patent Application No. 2021-126105, filed on Jul. 30, 2021, the entire content of which is incorporated herein by reference.

BACKGROUND OF THE INVENTION

1. Field of the Invention

The present invention relates to a semiconductor light-emitting element and a method of manufacturing a semiconductor light-emitting element.

2. Description of the Related Art

A semiconductor light-emitting element includes an n-type semiconductor layer, an active layer, and a p-type semiconductor layer stacked on a substrate. A p-side contact electrode is provided on the p-type semiconductor layer, and a dielectric layer is provided on the p-side contact electrode. In a semiconductor light-emitting element for outputting deep ultraviolet light, rhodium (Rh) having a high reflectivity for the emission wavelength may be used in the p-side contact electrode (see, for example, JP6839320B).

Adhesion of Rh to a dielectric material is poor so that the element reliability may be lowered due to exfoliation of the dielectric layer. Further, when the dielectric layer on the p-side contact electrode is removed to form a connection opening, a damage associated with the removal of the dielectric layer may be caused in the p-side contact electrode exposed in the connection opening with the result that the reflective characteristics of the p-side contact electrode may be lowered.

SUMMARY OF THE INVENTION

The present invention addresses the above-described issues and a purpose thereof is to provide a technology for improving the reliability of a semiconductor light-emitting element.

A semiconductor light-emitting element according to an embodiment of the present invention includes: an n-type semiconductor layer made of an n-type AlGaN-based semiconductor material; an active layer provided on the n-type semiconductor layer and made of an AlGaN-based semiconductor material; a p-type semiconductor layer provided on the active layer; a p-side contact electrode that includes a Rh layer in contact with an upper surface of the p-type semiconductor layer; a p-side electrode covering layer that is in contact with an upper surface and a side surface of the p-side contact electrode and includes a Ti layer, a Rh layer, and a TiN layer stacked successively; a dielectric covering layer that has a connection opening provided on the p-side electrode covering layer and covers the p-side electrode covering layer in a portion different from the connection opening; and a p-side current diffusion layer that connects to the p-side electrode covering layer in the connection opening.

Another embodiment of the present invention relates to a method of manufacturing a semiconductor light-emitting element. The method includes: forming an active layer made of an AlGaN-based semiconductor material on an n-type semiconductor layer made of an n-type AlGaN-based semiconductor material; forming a p-type semiconductor layer on the active layer; forming a p-side contact electrode that includes a Rh layer in contact with an upper surface of the p-type semiconductor layer; forming a p-side electrode covering layer in contact with an upper surface and a side surface of the p-side contact electrode and including a Ti layer, a Rh layer, and a TiN layer stacked successively; forming a dielectric covering layer that covers an upper surface and a side surface of the p-side electrode covering layer; removing the dielectric covering layer on the p-side electrode covering layer to form a connection opening in which the p-side electrode covering layer is exposed; and forming a p-side current diffusion layer that connects to the p-side electrode covering layer in the connection opening. The Rh layer included in the p-side contact electrode is formed by deposition, and the Rh layer included in the p-side current diffusion layer is formed by sputtering.

DETAILED DESCRIPTION OF THE INVENTION

Figure 1:
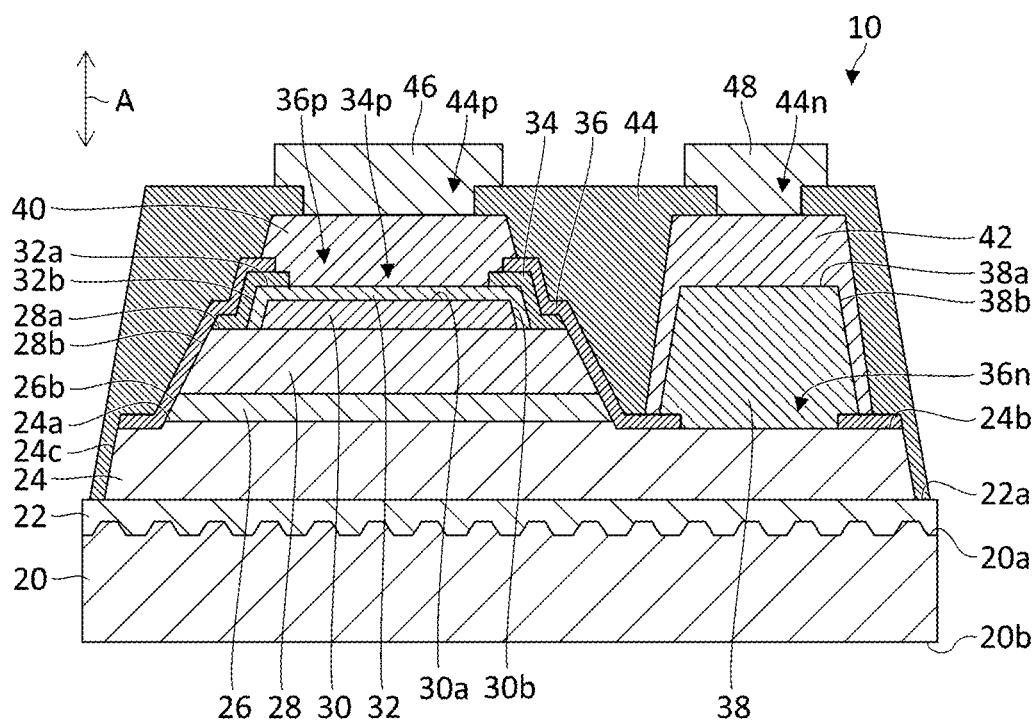
FIG. 1 is a cross sectional view schematically showing a configuration of a semiconductor light-emitting element according to an embodiment.

The invention will now be described by reference to the preferred embodiments. This does not intend to limit the scope of the present invention, but to exemplify the invention.

A detailed description will be given of an embodiment of the present invention with reference to the drawings. The numerals are used in the description to denote the same elements and a duplicate description is omitted as appropriate. To facilitate the understanding, the relative dimensions of the constituting elements in the drawings do not necessarily mirror the relative dimensions in the actual light-emitting element.

The semiconductor light-emitting element according to the embodiment is configured to emit "deep ultraviolet light" having a central wavelength $\lambda$ approximately equal to or less than 360 nm and is a so-called deep ultraviolet-light-emitting diode (UV-LED) chip. To output deep ultraviolet light having such a wavelength, an aluminum gallium nitride (AlGaN)-based semiconductor material having a band gap approximately equal to or more than 3.4 eV is used. The embodiment particularly shows a case of emitting deep ultraviolet light having a central wavelength A of about 240 nm-320 nm.

In this specification, the term "AlGaN-based semiconductor material" refers to a semiconductor material containing at least aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0<x+y\leq1$, $0<x<1$, $0<y<1$). The AlGaN-based semiconductor material shall encompass AlGaN or InAlGaN. The "AlGaN-based semiconductor material" in this specification has a molar fraction of AlN and a molar fraction of GaN equal to or more than 1%, and, preferably, equal to or more than 5%, equal to or more than 10%, or equal to or more than 20%.

Those materials that do not contain AlN may be distinguished by referring to them as "GaN-based semiconductor materials". "GaN-based semiconductor materials" include GaN or InGaN. Similarly, those materials that do not contain GaN may be distinguished by referring to them as "AlN-based semiconductor materials". "AlN-based semiconductor materials" include AlN or InAlN.

FIG. 1 is a cross sectional view schematically showing a configuration of a semiconductor light-emitting element 10 according to the embodiment. The semiconductor light-emitting element 10 includes a substrate 20, a base layer 22, an n-type semiconductor layer 24, an active layer 26, a p-type semiconductor layer 28, a p-side contact electrode 30, a p-side electrode covering layer 32, a first dielectric covering layer 34, a second dielectric covering layer 36, an n-side contact electrode 38, a p-side current diffusion layer 40, an n-side current diffusion layer 42, a dielectric protective layer 44, a p-side pad electrode 46, and an n-side pad electrode 48.

Referring to FIG. 1, the direction indicated by the arrow A may be referred to as "vertical direction" or "direction of thickness". Further, the direction away from the substrate 20 may be defined as "upward", and the direction toward the substrate 20 may be defined as "downward".

The substrate 20 includes a first principal surface 20a and a second principal surface 20b opposite to the first principal surface 20a. The first principal surface 20a is a crystal growth surface for growing the layers from the base layer 22 to the p-type semiconductor layer 28. The substrate 20 is made of a material having translucency for the deep ultraviolet light emitted by the semiconductor light-emitting element 10 and is made of, for example, sapphire ($Al_2O_3$). A fine concave-convex pattern having a submicron (1 μm or less) depth and pitch is formed on the first principal surface 20a. The substrate 20 like this is also called a patterned sapphire substrate (PSS). The second principal surface 20b is a light extraction substrate for extracting the deep ultraviolet light emitted by the active layer 26 outside. The substrate 20 may be made of AlN or made of AlGaN. The substrate 20 may be an ordinary substrate in which the first principal surface 20a is comprised of a flat surface that is not patterned.

The base layer 22 is provided on the first principal surface 20a of the substrate 20. The base layer 22 is a foundation layer (template layer) to form the n-type semiconductor layer 24. For example, the base layer 22 is an undoped AlN layer and is, specifically, an AlN (HT-AlN; High Temperature AlN) layer grown at a high temperature. The base layer 22 may further include an undoped AlGaN layer formed on the AlN layer. The base layer 22 may be comprised only of an undoped AlGaN layer when the substrate 20 is an AlN substrate or an AlGaN substrate. In other words, the base layer 22 includes at least one of an undoped AlN layer or an undoped AlGaN layer.

The n-type semiconductor layer 24 is provided on an upper surface 22a of the base layer 22. The n-type semiconductor layer 24 is made of an n-type AlGaN-based semiconductor material. For example, the n-type semiconductor layer 24 is doped with Si as an n-type impurity. The composition ratio of the n-type semiconductor layer 24 is selected to transmit the deep ultraviolet light emitted by the active layer 26. For example, the n-type semiconductor layer 24 is formed such that the molar fraction of AlN is equal to or more than 25%, and, preferably, equal to or more than 40% or equal to or more than 50%. The n-type semiconductor layer 24 has a band gap larger than the wavelength of the deep ultraviolet light emitted by the active layer 26. For example, the n-type semiconductor layer 24 is formed to have a band gap equal to or more than 4.3 eV. It is preferable to form the n-type semiconductor layer 24 such that the molar fraction of AlN is equal to or less than 80%, i.e., the band gap is equal to or less than 5.5 eV. It is more desired to form the n-type semiconductor layer 24 such that the molar fraction of AlN is equal to or less than 70% (i.e., the band gap is equal to or less than 5.2 eV). The n-type semiconductor layer 24 has a thickness equal to or more than 1 μm and equal to or less than 3 μm. For example, the n-type semiconductor layer 24 has a thickness of about 2 μm.

The n-type semiconductor layer 24 is formed such that the concentration of Si as the impurity is equal to or more than $1\times10^{18}/cm^3$ and equal to or less than $5\times10^{19}/cm^3$. It is preferred to form the n-type semiconductor layer 24 such that the Si concentration is equal to or more than $5\times10^{18}/cm^3$ and equal to or less than $3\times10^{19}/cm^3$ and, more preferably, equal to or more than $7\times10^{18}/cm^3$ and equal to or less than $2\times10^{19}/cm^3$. In one example, the Si concentration in the n-type semiconductor layer 24 is around $1\times10^{19}/cm^3$ and, more specifically, is in a range equal to or more than $8\times10^{18}/cm^3$ and equal to or less than $1.5\times10^{19}/cm^3$.

The n-type semiconductor layer 24 includes a first upper surface 24a and a second upper surface 24b. The first upper surface 24a is where the active layer 26 is formed, and the second upper surface 24b is where the active layer 26 is not formed.

The active layer 26 is provided on the first upper surface 24a of the n-type semiconductor layer 24. The active layer 26 is made of an AlGaN-based semiconductor material and has a double heterojunction structure by being sandwiched between the n-type semiconductor layer 24 and the p-type semiconductor layer 28. To output deep ultraviolet light having a wavelength equal to or less than 355 nm, the active layer 26 is formed to have a band gap equal to or more than 3.4 eV. For example, the AlN composition ratio of the active layer 26 is selected so as to output deep ultraviolet light having a wavelength equal to or less than 320 nm.

For example, the active layer 26 has a monolayer or multilayer quantum well structure and is comprised of a barrier layer made of an undoped AlGaN-based semiconductor material and a well layer made of an undoped AlGaN-based semiconductor material. The active layer 26 includes, for example, a first barrier layer directly in contact with the n-type semiconductor layer 24 and a first well layer provided on the first barrier layer. One or more pairs of the barrier layer and the well layer may be additionally provided between the first well layer and the p-type semiconductor layer 28. Each of the barrier layer and the well layer has a thickness equal to or more than 1 nm and equal to or less than 20 nm, and have, for example, a thickness equal to or more than 2 nm and equal to or less than 10 nm.

An electron blocking layer may further be provided between the active layer 26 and the p-type semiconductor layer 28. The electron blocking layer is made of an undoped AlGaN-based semiconductor material and is formed such that, for example, the molar fraction of AlN is equal to or more than 40%, and, preferably, equal to or more than 50%. The electron blocking layer may be formed such that the molar fraction of AlN is equal to or more than 80% or may be made of an AlN-based semiconductor material that does not contain GaN. The electron blocking layer has a thickness equal to or more than 1 nm and equal to or less than 10 nm. For example, the electron blocking layer has a thickness equal to or more than 2 nm and equal to or less than 5 nm.

The p-type semiconductor layer 28 is formed on the active layer 26. The p-type semiconductor layer 28 is a p-type AlGaN-based semiconductor material layer or a p-type GaN-based semiconductor material layer. For example, the p-type semiconductor layer 28 is an AlGaN layer or a GaN layer doped with magnesium (Mg) as a p-type impurity. The p-type semiconductor layer 28 has, for example, a thickness equal to or more than 20 nm and equal to or less than 400 nm.

The p-type semiconductor layer 28 may be comprised of a plurality of layers. The p-type semiconductor layer 28 may include, for example, a p-type clad layer and a p-type contact layer. The p-type clad layer is a p-type AlGaN layer having a relatively high AlN ratio as compared with the p-type contact layer and is provided to be directly in contact with the active layer 26. The p-type contact layer is a p-type AlGaN layer or a p-type GaN layer having a relatively low AlN ratio as compared with the p-type clad layer. The p-type contact layer is provided on the p-type clad layer and is provided to be directly in contact with the p-side contact electrode 30. The p-type clad layer may include a p-type first clad layer and a p-type second clad layer.

The composition ratio of the p-type first clad layer is selected to transmit the deep ultraviolet light emitted by the active layer 26. For example, the p-type first clad layer is formed such that the molar fraction of AlN is equal to or more than 25%, and, preferably, equal to or more than 40% or equal to or more than 50%. The AlN ratio of the p-type first clad layer is, for example, similar to the AlN ratio of the n-type semiconductor layer 24 or larger than the AlN ratio of the n-type semiconductor layer 24. The AlN ratio of the p-type clad layer may be equal to or more than 70% or equal to or more than 80%. The p-type first clad layer has a thickness equal to or more than 10 nm and equal to or less than 100 nm. For example, the p-type first clad layer has a thickness equal to or more than 15 nm and equal to or less than 70 nm.

The p-type second clad layer is provided on the p-type first clad layer. The p-type second clad layer is a p-type AlGaN layer having a medium AlN ratio and has an AlN ratio lower than that of the p-type first clad layer and higher than that of the p-type contact layer. For example, the p-type second clad layer is formed such that the molar fraction of AlN is equal to or more than 25%, and, preferably, equal to or more than 40% or equal to or more than 50%. The AlN ratio of the p-type second clad layer is configured to be, for example, about ±10% of the AlN ratio of the n-type semiconductor layer 24. The p-type second clad layer has a thickness equal to or more than 5 nm and equal to or less than 250 nm and has, for example, a thickness equal to or more than 10 nm and equal to or less than 150 nm. The p-type second clad layer may not be provided. The p-type clad layer may be comprised only of the p-type first clad layer.

The p-type contact layer is a p-type AlGaN layer or a p-type GaN layer having a relatively low AlN ratio. The p-type contact layer is formed such that the AlN ratio is equal to or less than 20% in order to obtain proper ohmic contact with the p-side contact electrode 30. Preferably, the p-type contact layer is formed such that the AlN ratio is equal to or less than 10%, equal to or less than 5%, or 0%. In other words, the p-type contact layer may be made of a p-type GaN-based semiconductor material that does not substantially contain AlN. As a result, the p-type contact layer could absorb the deep ultraviolet light emitted by the active layer 26. It is preferred to form the p-type contact layer to be thin to reduce the quantity of absorption of the deep ultraviolet light emitted by the active layer 26. The p-type contact layer has a thickness equal to or more than 5 nm and equal to or less than 30 nm and has, for example, a thickness equal to or more than 10 nm and equal to or less than 20 nm.

The p-side contact electrode 30 is provided on an upper surface 28a of the p-type semiconductor layer 28. The p-side contact electrode 30 can be in ohmic contact with the p-type semiconductor layer 28 (for example, the p-type contact layer) and is made of a material having a high reflectivity for the deep ultraviolet light emitted by the active layer 26. The p-side contact electrode 30 includes a Rh layer directly in contact with the upper surface 28a of the p-type semiconductor layer 28. The p-side contact electrode 30 may be, for example, comprised only of the Rh layer. The thickness of the Rh layer included in the p-side contact electrode 30 is equal to or more than 50 nm and equal to or less than 200 nm and is, for example, equal to or more than 70 nm and equal to or less than 150 nm. The film density of the Rh layer included in the p-side contact electrode 30 is equal to or more than 12 g/cm$^3$ and is, for example, equal to or more than 12.2 g/cm$^3$ and equal to or less than 12.5 g/cm$^3$. By configuring the film density of the Rh layer included in the p-side contact electrode 30 to be large, the function of the p-side contact electrode 30 as a reflection electrode can be enhanced. By configuring the film density of the Rh layer to be equal to or more than 12 g/cm$^3$, the reflectivity equal to or more than 65% for deep ultraviolet light having a wavelength of 280 nm can be obtained.

The p-side electrode covering layer 32 is directly in contact with an upper surface 30a and a side surface 30b of the p-side contact electrode 30 and is provided to cover the entirety of the p-side contact electrode 30. The p-side electrode covering layer 32 includes a Ti layer, a Rh layer, and a TiN layer stacked successively. The detail of the configuration of the p-side electrode covering layer 32 will be described separately with reference to FIG. 2.

The first dielectric covering layer 34 has a first connection opening 34p provided on the upper surface 32a of the p-side electrode covering layer 32 and covers the p-side electrode covering layer 32 in a portion different from the first connection opening 34p. The first dielectric covering layer 34 is directly in contact with the upper surface 32a and a side surface 32b of the p-side electrode covering layer 32 and is provided to be directly in contact with the upper surface 28a of the p-type semiconductor layer 28. The first dielectric covering layer 34 is not in contact with a side surface 28b of the p-type semiconductor layer 28 and a side surface 26a of the active layer 26.

The first dielectric covering layer 34 is made of a first oxide material and is made of silicon oxide ($SiO_2$), aluminum oxide ($Al_2O_3$), or hafnium oxide ($HfO_2$). The first dielectric covering layer 34 is preferably made of $SiO_2$. The thickness of the first dielectric covering layer 34 is equal to or more than 50 nm and is, for example, equal to or more than 100 nm and equal to or less than 500 nm.

The second dielectric covering layer 36 has a second connection opening 36p provided on the upper surface 32a of the p-side electrode covering layer 32 and covers the first dielectric covering layer 34 in a portion different from the second connection opening 36p. The second connection opening 36p is provided at a position that communicates with the first connection opening 34p. The range in which the second connection opening 36p is formed is larger than the range in which the first connection opening 34p is formed. For example, the outer circumference of the second connection opening 36p is located outside the first connection opening 34p. The second dielectric covering layer 36 has a contact opening 36n provided on the second upper surface 24b of the n-type semiconductor layer 24 and covers the second upper surface 24b of the n-type semiconductor layer 24 in a portion different from the contact opening 36n. The second dielectric covering layer 36 is provided to be directly in contact with the first dielectric covering layer 34, directly in contact with the side surface 28b of the p-type semiconductor layer 28 and a side surface 26b of the active layer 26, and directly in contact with the second upper surface 24b of the n-type semiconductor layer 24.

The second dielectric covering layer 36 is made of a second oxide material different from the first oxide material forming the first dielectric covering layer 34 and is made of $SiO_2$, $Al_2O_3$, or $HfO_2$. The second dielectric covering layer 36 is preferably made of $Al_2O_3$. The thickness of the second dielectric covering layer 36 is equal to or more than 10 nm and equal to or less than 100 nm and is, for example, equal to or more than 20 nm and equal to or less than 50 nm.

The n-side contact electrode 38 is provided on the second upper surface 24b of the n-type semiconductor layer 24. The n-side contact electrode 38 is provided to block the contact opening 36n and overlaps the second dielectric covering layer 36 outside the contact opening 36n. The n-side contact electrode 38 includes a first Ti layer, an Al layer, a second Ti layer, and a TiN layer stacked successively. The detail of the configuration of the n-side contact electrode 38 will be described separately with reference to FIG. 3.

The p-side current diffusion layer 40 is provided on the upper surface 32a of the p-side electrode covering layer 32 and connects to the p-side electrode covering layer 32 in the connection openings (the first connection opening 34p and the second connection opening 36p). The p-side current diffusion layer 40 is provided to block the first connection opening 34p and the second connection opening 36p, overlaps the first dielectric covering layer 34 outside the first connection opening 34p, and overlaps the second dielectric covering layer 36 outside the second connection opening 36p. The p-side current diffusion layer 40 includes a TiN layer, a Ti layer, a Rh layer, and a TiN layer stacked successively. The detail of the configuration of the p-side current diffusion layer 40 will be described separately with reference to FIG. 2.

The n-side current diffusion layer 42 is provided to cover an upper surface 38a and a side surface 38b of the n-side contact electrode 38. The n-side current diffusion layer 42 overlaps the second dielectric covering layer 36 outside the n-side contact electrode 38. The n-side current diffusion layer 42 is configured in a manner similar to the p-side current diffusion layer 40 and includes a TiN layer, a Ti layer, a Rh layer, and a TiN layer stacked successively. The detail of the configuration of the n-side current diffusion layer 42 will be described separately with reference to FIG. 3.

The dielectric protective layer 44 includes a p-side pad opening 44p provided on the p-side current diffusion layer 40 and an n-side pad opening 44n provided on the n-side current diffusion layer 42. The dielectric protective layer 44 covers the p-side current diffusion layer 40 in a portion different from the p-side pad opening 44p and covers the n-side current diffusion layer 42 in a portion different from the n-side pad opening 44n. The dielectric protective layer 44 is provided to be directly in contact with the upper surface 22a of the base layer 22, a side surface 24c of the n-type semiconductor layer 24, the second dielectric covering layer 36, the p-side current diffusion layer 40, and the n-side current diffusion layer 42.

The dielectric protective layer 44 is made of a third oxide material different from the second oxide material forming the second dielectric covering layer 36 and is made of silicon oxide ($SiO_2$), aluminum oxide ($Al_2O_3$), or hafnium oxide ($HfO_2$). The dielectric protective layer 44 is preferably made of $SiO_2$. The thickness of the dielectric protective layer 44 is equal to or more than 300 nm and equal to or less than 1500 nm and is, for example, equal to or more than 600 nm and equal to or less than 1000 nm.

The p-side pad electrode 46 is provided on the p-side current diffusion layer 40 and connects to the p-side current diffusion layer 40 in the p-side pad opening 44p. The p-side pad electrode 46 is provided to block the p-side pad opening 44p and overlaps the dielectric protective layer 44 outside the p-side pad opening 44p. The p-side pad electrode 46 is electrically connected to the p-side contact electrode 30 via the p-side current diffusion layer 40 and the p-side electrode covering layer 32.

The n-side pad electrode 48 is provided on the n-side current diffusion layer 42 and connects to the n-side current diffusion layer 42 in the n-side pad opening 44n. The n-side pad electrode 48 is provided to block the n-side pad opening 44n and overlaps the dielectric protective layer 44 outside the n-side pad opening 44n. The n-side pad electrode 48 is electrically connected to the n-side contact electrode 38 via the n-side current diffusion layer 42.

The p-side pad electrode 46 and the n-side pad electrode 48 are portions bonded when the semiconductor light-emitting element 10 is mounted on a package substrate or the like. The p-side pad electrode 46 and the n-side pad electrode 48 include, for example, a Ni/Au, Ti/Au, or Ti/Pt/Au stack structure. The thickness of each of the p-side pad electrode 46 and the n-side pad electrode 48 is equal to or more than 100 nm and is, for example, equal to or more than 200 nm and equal to or less than 1000 nm.

Figure 2:
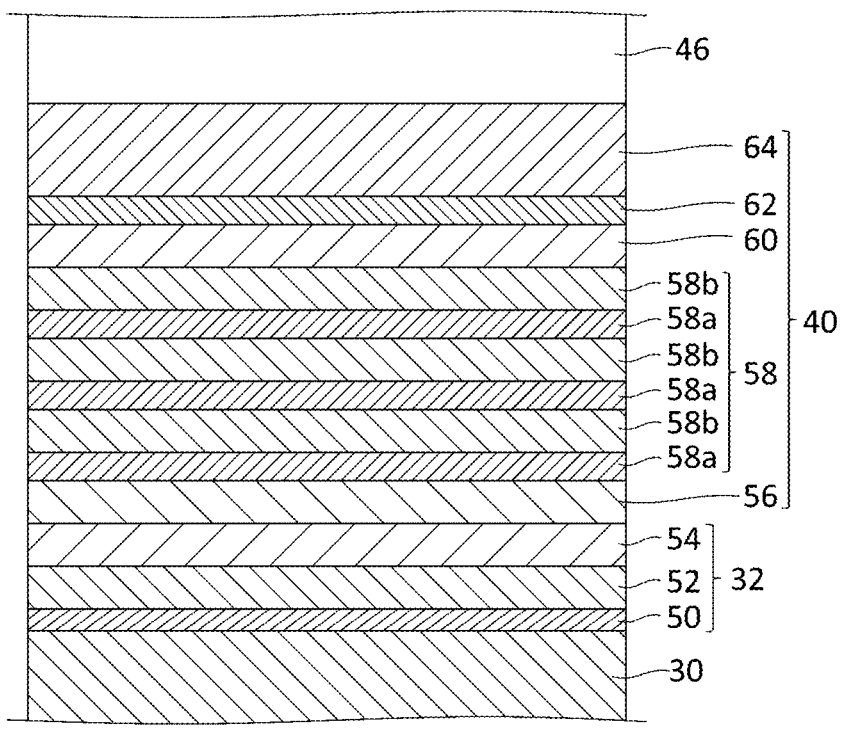
FIG. 2 is a cross sectional view schematically showing a configuration of the p-side electrode covering layer and the p-side current diffusion layer.

FIG. 2 schematically shows a configuration of the p-side electrode covering layer 32 and the p-side current diffusion layer 40. The p-side electrode covering layer 32 includes a Ti layer 50, a Rh layer 52, and a TiN layer 54. The p-side current diffusion layer 40 includes a first TiN layer 56, a multilayer metal film 58, and a second TiN layer 60. The p-side current diffusion layer 40 may further include a Ti layer 62 and an Au layer 64.

The Ti layer 50 of the p-side electrode covering layer 32 is directly in contact with the upper surface 30a and the side surface 30b of the p-side contact electrode 30. The thickness of the Ti layer 50 is equal to or more than 1 nm and equal to or less than 50 nm and is, for example, equal to or more than 5 nm and equal to or less than 25 nm. The Ti layer 50 increases adhesion between the Rh layer of the p-side contact electrode 30 and the Rh layer 52 of the p-side electrode covering layer 32.

The Rh layer 52 of the p-side electrode covering layer 32 is provided on the Ti layer 50 and is directly in contact with the Ti layer 50. The thickness of the Rh layer 52 is equal to or more than 5 nm and equal to or less than 100 nm and is, for example, equal to or more than 10 nm and equal to or less than 50 nm. The film density of the Rh layer 52 is lower than the film density of the Rh layer included in the p-side contact electrode 30. The film density of the Rh layer 52 is less than 12 g/cm$^3$ and is, for example, equal to or more than 11.5 g/cm$^3$ and equal to or less than 11.8 g/cm$^3$.

The TiN layer 54 of the p-side electrode covering layer 32 is provided on the Rh layer 52 and is directly in contact with the Rh layer 52. The TiN layer 54 is made of titanium nitride having conductivity. The thickness of the TiN layer 54 is equal to or more than 5 nm and equal to or less than 100 nm and is, for example, equal to or more than 10 nm and equal to or less than 50 nm.

The first TiN layer 56 of the p-side current diffusion layer 40 is directly in contact with the p-side electrode covering layer 32. The multilayer metal film 58 of the p-side current diffusion layer 40 is provided on the first TiN layer 56. The second TiN layer 60 of the p-side current diffusion layer 40 is provided on the multilayer metal film 58. The first TiN layer 56 and the second TiN layer 60 are made of conductive TiN. The thickness of each of the first TiN layer 56 and the second TiN layer 60 is equal to or more than 10 nm and equal to or less than 200 nm and is, for example, equal to or more than 50 nm and equal to or less than 150 nm.

The multilayer metal film 58 of the p-side current diffusion layer 40 includes a Ti layer 58a and a Rh layer 58b. The multilayer metal film 58 may include a plurality of Ti layers 58a and a plurality of Rh layers 58b that are alternately stacked. The thickness of each of the Ti layer 58a and the Rh layer 58b is equal to or more than 10 nm and equal to or less than 200 nm and is, for example, equal to or more than 20 nm and equal to or less than 150 nm. The film density of the Rh layer 58b included in the p-side current diffusion layer 40 is higher than the film density of the Rh layer 52 included in the p-side electrode covering layer 32. The film density of the Rh layer 58b included in the p-side current diffusion layer 40 is equal to or more than 12 g/cm$^3$ and is, for example, equal to or more than 12.2 g/cm$^3$ and equal to or less than 12.5 g/cm$^3$.

The Ti layer 62 of the p-side current diffusion layer 40 is provided on the second TiN layer 60. The thickness of the Ti layer 62 is equal to or more than 1 nm and equal to or less than 50 nm and is, for example, equal to or more than 5 nm and equal to or less than 25 nm. The Au layer 64 of the p-side current diffusion layer 40 is provided on the Ti layer 62. The thickness of the Au layer 64 is equal to or more than 100 nm and equal to or less than 500 nm and is, for example, equal to or more than 150 nm and equal to or less than 300 nm.

Figure 3:
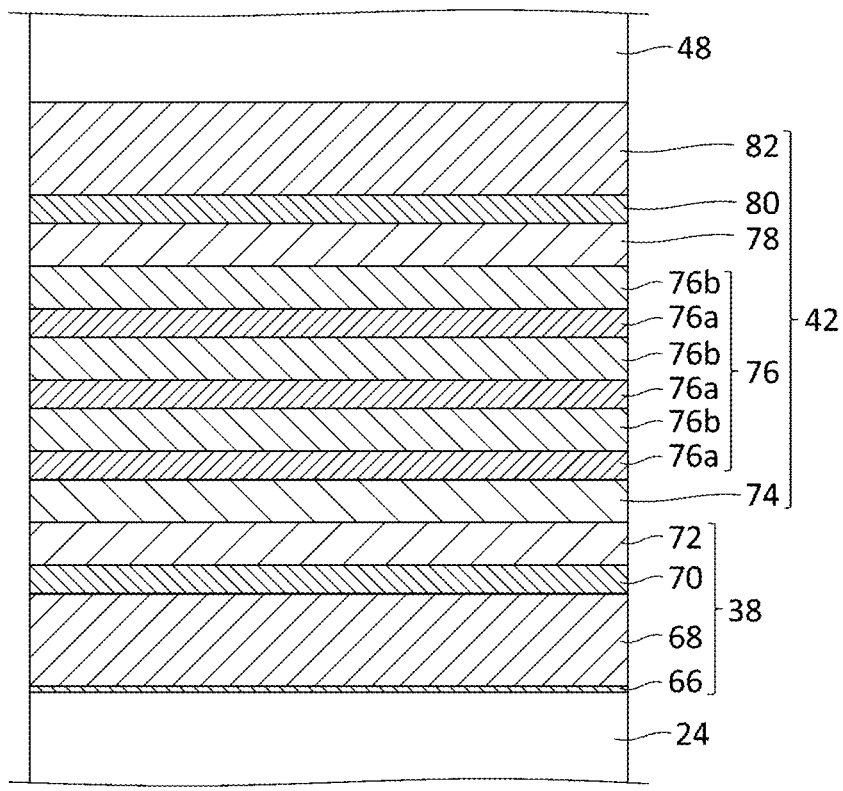
FIG. 3 is a cross sectional view schematically showing a configuration of the n-side contact electrode and the n-side current diffusion layer.

FIG. 3 schematically shows a configuration of the n-side contact electrode 38 and the n-side current diffusion layer 42. The n-side contact electrode 38 includes a first Ti layer 66, an Al layer 68, a second Ti layer 70, and a TiN layer 72. The n-side current diffusion layer 42 includes a first TiN layer 74, a multilayer metal film 76, and a second TiN layer 78. The n-side current diffusion layer 42 may further include a Ti layer 80 and an Au layer 82.

The first Ti layer 66 of the n-side contact electrode 38 is directly in contact with the second upper surface 24b of the n-type semiconductor layer 24. The thickness of the first Ti layer 66 is equal to or more than 1 nm and equal to or less than 10 nm and is, preferably, equal to or less than 5 nm or equal to or less than 2 nm. The Al layer 68 of the n-side contact electrode 38 is provided on the first Ti layer 66 and is directly in contact with the first Ti layer 66. The thickness of the Al layer 68 is equal to or more than 200 nm and is, for example, equal to or more than 300 nm and equal to or less than 1000 nm. The second Ti layer 70 of the n-side contact electrode 38 is provided on the Al layer 68 and is directly in contact with the Al layer 68. The thickness of the second Ti layer 70 is equal to or more than 1 nm and equal to or less than 50 nm and is, for example, equal to or more than 5 nm and equal to or less than 25 nm. The TiN layer 72 of the n-side contact electrode 38 is provided on the second Ti layer 70 and is directly in contact with the second Ti layer 70. The TiN layer 72 is made of conductive TiN. The thickness of the TiN layer 72 is equal to or more than 5 nm and equal to or less than 100 nm and is, for example, equal to or more than 10 nm and equal to or less than 50 nm.

The first TiN layer 74 of the n-side current diffusion layer 42 is directly in contact with the upper surface 38a and the side surface 38b of the n-side contact electrode 38. The multilayer metal film 76 of the n-side current diffusion layer 42 is provided on the first TiN layer 74. The second TiN layer 78 of the n-side current diffusion layer 42 is provided on the multilayer metal film 76. The first TiN layer 74 and the second TiN layer 78 are made of conductive TiN. The thickness of each of the first TiN layer 74 and the second TiN layer 78 is equal to or more than 10 nm and equal to or less than 200 nm and is, for example, equal to or more than 50 nm and equal to or less than 150 nm.

Like the multilayer metal film 58 of the p-side current diffusion layer 40, the multilayer metal film 76 of the n-side current diffusion layer 42 is comprised of a Ti layer 76a and a Rh layer 76b. The multilayer metal film 76 may include a plurality of Ti layers 76a and a plurality of Rh layers 76b that are alternately stacked. The thickness of each of the Ti layer 76a and the Rh layer 76b included in the multilayer metal film 76 is equal to or more than 10 nm and equal to or less than 200 nm and is, for example, equal to or more than 20 nm and equal to or less than 150 nm. The film density of the Rh layer 76b included in the n-side current diffusion layer 42 is similar to the film density of the Rh layer 58b included in the p-side current diffusion layer 40. The film density of the Rh layer 76b included in the n-side current diffusion layer 42 is equal to or more than 12 g/cm$^3$ and is, for example, equal to or more than 12.2 g/cm$^3$ and equal to or less than 12.5 g/cm$^3$.

The Ti layer 80 of the n-side current diffusion layer 42 is provided on the second TiN layer 78. The thickness of the Ti layer 80 is equal to or more than 1 nm and equal to or less than 50 nm and is, for example, equal to or more than 5 nm and equal to or less than 25 nm. The Au layer 82 of the n-side current diffusion layer 42 is provided on the Ti layer 80. The thickness of the Au layer 82 is equal to or more than 100 nm and equal to or less than 500 nm and is, for example, equal to or more than 150 nm and equal to or less than 300 nm.

A description will now be given of a method of manufacturing the semiconductor light-emitting element 10. FIGS. 4-12 schematically show steps of manufacturing the semiconductor light-emitting element 10. First, referring to FIG. 4, the base layer 22, the n-type semiconductor layer 24, the active layer 26, and the p-type semiconductor layer 28 are formed on the first principal surface 20a of the substrate 20 sequentially.

The substrate 20 is, for example, a patterned sapphire substrate. The base layer 22 includes, for example, an HT-AlN layer and an undoped AlGaN layer. The n-type semiconductor layer 24, the active layer 26, and the p-type semiconductor layer 28 are semiconductor layers made of an AlGaN-based semiconductor material, an AlN-based semiconductor material, or a GaN-based semiconductor material and can be formed by a well-known epitaxial growth method such as the metal organic vapor phase epitaxy (MOVPE) method and the molecular beam epitaxy (MBE) method.

Figure 4:
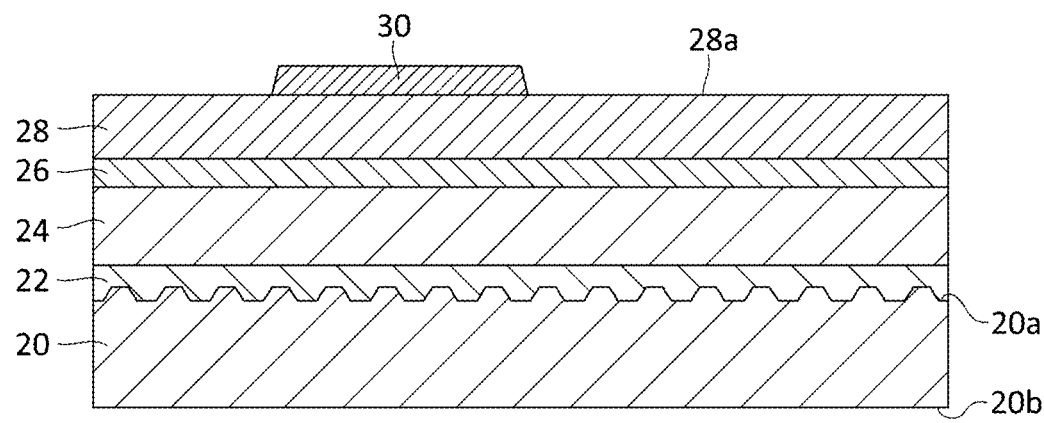
FIG. 4 schematically shows a step of manufacturing the semiconductor light-emitting element.

Subsequently, as shown in FIG. 4, the p-side contact electrode 30 is formed on the upper surface 28a of the p-type semiconductor layer 28 by using, for example, a publicly known lithographic technology. The p-side contact electrode 30 includes a Rh layer directly in contact with the upper surface 28a of the p-type semiconductor layer 28. The Rh layer of the p-side contact electrode 30 is formed by deposition at a temperature equal to or less than 100° C. By forming the Rh layer by deposition, the damage to the upper surface 28a of the p-type semiconductor layer 28 can be reduced and the contact resistance of the p-side contact electrode 30 can be improved as compared with the case of using sputtering.

After the p-side contact electrode 30 is formed, the p-side contact electrode 30 is annealed. The p-side contact electrode 30 is annealed by using, for example, the rapid thermal annealing (RTA) method at a temperature equal to or more than 500° C. and equal to or less than 650° C. The annealing process of the p-side contact electrode 30 lowers the contact resistance of the p-side contact electrode 30 and increases the film density of the Rh layer included in the p-side contact electrode 30 to be equal to or more than 12 $g/cm^3$. The film density of the Rh layer formed by deposition at a temperature equal to or less than 100° C. is less than 12 $g/cm^3$ and is, for example, equal to or more than 11.6 $g/cm^3$ and equal to or less than 11.9 $g/cm^3$. When the film density of the Rh layer is less than 12 $g/cm^3$, the reflectivity for ultraviolet light having a wavelength of 280 nm will be less than 65% and will be about 60%-61%. Meanwhile, the annealed Rh layer has, for example, a film density equal to or more than 12.2 $g/cm^3$ and equal to or less than 12.5 $g/cm^3$ and has a reflectivity equal to or more than 65% and, for example, a reflectivity of about 66%-67%, for ultraviolet light having a wavelength of 280 nm.

Figure 5:
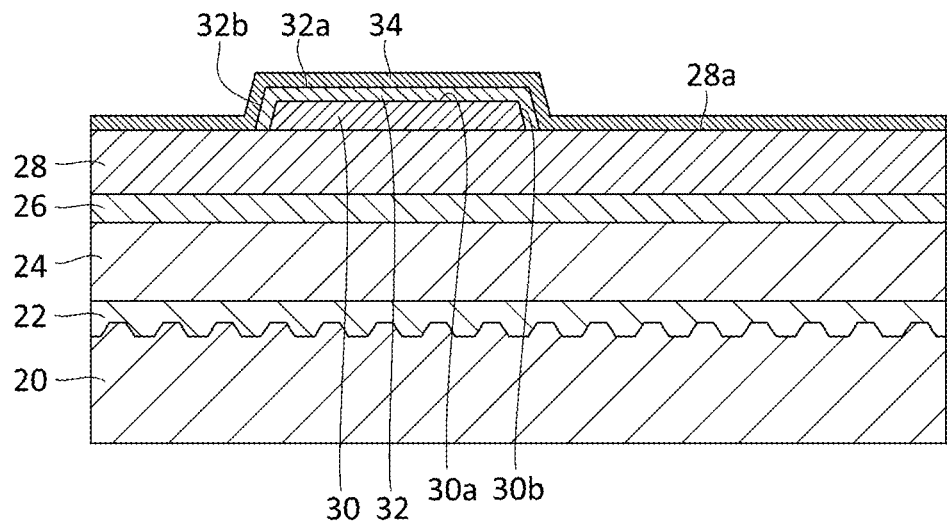
FIG. 5 schematically shows a step of manufacturing the semiconductor light-emitting element.

Subsequently, as shown in FIG. 5, the p-side electrode covering layer 32 is formed to cover the entirety of the p-side contact electrode 30 by using, for example, a publicly known lithographic technology. The p-side electrode covering layer 32 is in contact with the upper surface 30a and the side surface 30b of the p-side contact electrode 30 and includes the Ti layer 50, the Rh layer 52, and the TiN layer 54 (see FIG. 2) stacked successively. The Ti layer 50, the Rh layer 52, and the TiN layer 54 forming the p-side electrode covering layer 32 are formed by sputtering. For example, the Ti layer 50, the Rh layer 52, and the TiN layer 54 are formed by sputtering that uses Argon (Ar) gas at a temperature equal to or less than 100° C. By forming the p-side electrode covering layer 32 by sputtering, adhesion of the p-side electrode covering layer 32 to the p-side contact electrode 30 can be improved. The film density of the Rh layer formed by sputtering at a temperature equal to or less than 100° C. is less than 12 $g/cm^3$ and is, for example, equal to or more than 11.6 $g/cm^3$ and equal to or less than 11.9 $g/cm^3$.

Subsequently, as shown in FIG. 5, the first dielectric covering layer 34 is formed to cover the upper surface 28a of the p-type semiconductor layer 28 and cover the upper surface 32a and the side surface 32b of the p-side electrode covering layer 32. The first dielectric covering layer 34 is made of, for example, $SiO_2$ and can be formed by plasma enhanced chemical vapor deposition (PECVD).

Figure 6:
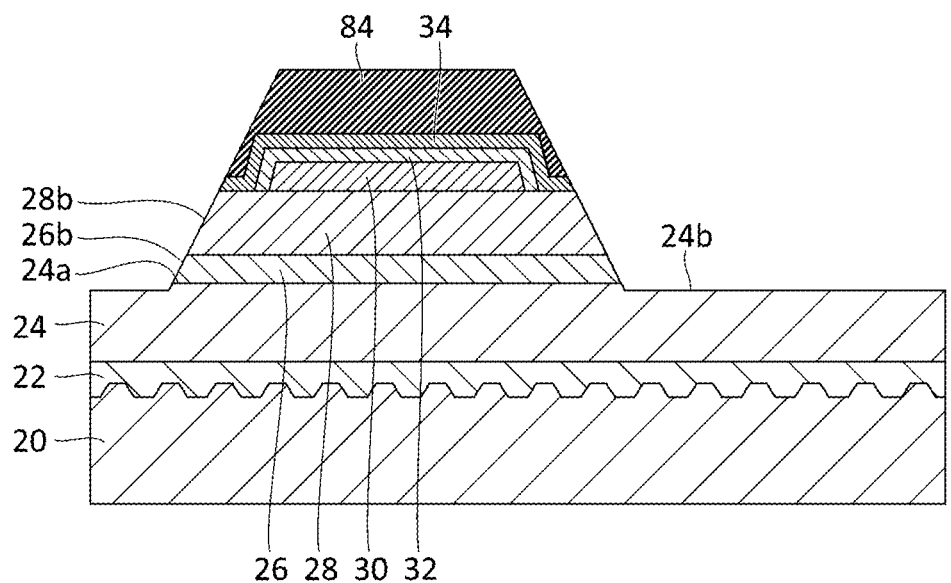
FIG. 6 schematically shows a step of manufacturing the semiconductor light-emitting element.

Subsequently, as shown in FIG. 6, a mask 84 is formed on the first dielectric covering layer 34 by using, for example, a publicly known lithographic technology. The mask 84 is formed in a range more extensive than the range in which the p-side contact electrode 30 and the p-side electrode covering layer 32 are formed. After the mask 84 is formed, the first dielectric covering layer 34, the p-type semiconductor layer 28, and the active layer 26 in a region not overlapping the mask 84 are removed by dry-etching or the like to expose the second upper surface 24b of the n-type semiconductor layer 24. This etching step forms the side surface 28b of the p-type semiconductor layer 28, the side surface 26b of the active layer 26, and the second upper surface 24b of the n-type semiconductor layer 24. The mask 84 is then removed.

Figure 7:
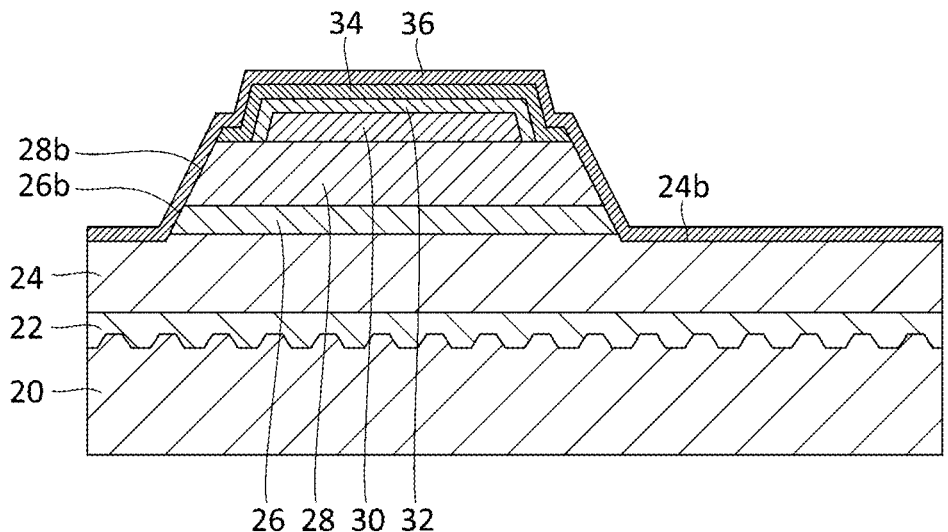
FIG. 7 schematically shows a step of manufacturing the semiconductor light-emitting element.

Subsequently, as shown in FIG. 7, the second dielectric covering layer 36 is formed. The second dielectric covering layer 36 is provided to be directly in contact with and to cover the second upper surface 24b of the n-type semiconductor layer 24, the side surface 26b of the active layer 26, the side surface 28b of the p-type semiconductor layer 28, and the first dielectric covering layer 34. The second dielectric covering layer 36 is made of, for example, $Al_2O_3$ and can be formed by atomic layer deposition (ALD).

Figure 8:
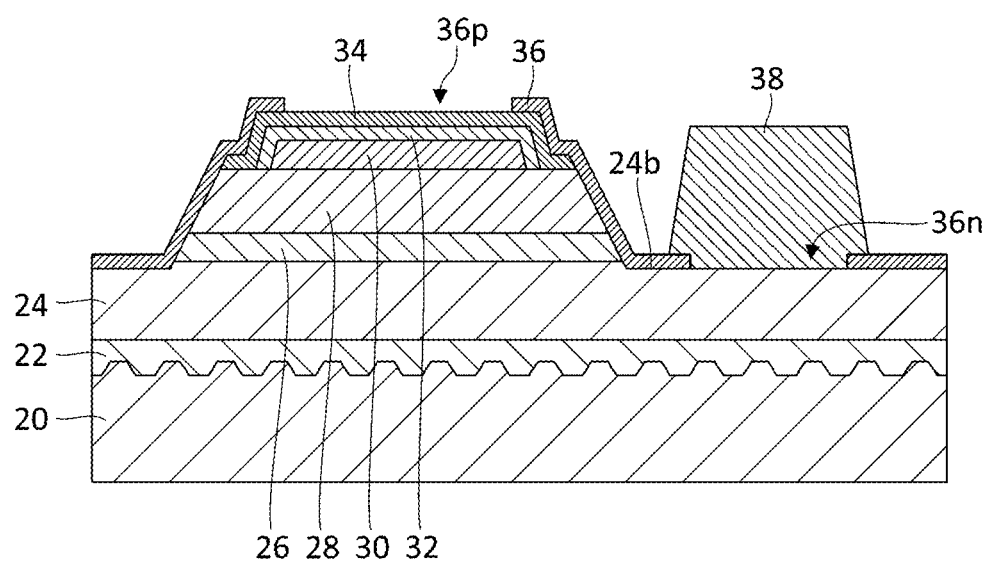
FIG. 8 schematically shows a step of manufacturing the semiconductor light-emitting element.

Subsequently, as shown in FIG. 8, the second dielectric covering layer 36 is removed in part by dry-etching or the like by using, for example, a publicly known photolithographic technology to form the second connection opening 36p and the contact opening 36n. The second connection opening 36p and the contact opening 36n are formed to extend through the second dielectric covering layer 36. The first dielectric covering layer 34 is exposed in the second connection opening 36p, and the second upper surface 24b of the n-type semiconductor layer 24 is exposed in the contact opening 36n.

Subsequently, as shown in FIG. 8, the n-side contact electrode 38 is formed on the second upper surface 24b of the n-type semiconductor layer 24 to block the contact opening 36n, by using, for example, a publicly known lithographic technology. The n-side contact electrode 38 is in contact with the second upper surface 24b of the n-type semiconductor layer 24 and includes the first Ti layer 66, the Al layer 68, the second Ti layer 70, and the TiN layer 72 (see FIG. 3) stacked successively. The first Ti layer 66, the Al layer 68, the second Ti layer 70, and the TiN layer 72 forming the n-side contact electrode 38 are formed by sputtering.

After the n-side contact electrode 38 is formed, the n-side contact electrode 38 is annealed. The n-side contact electrode 38 is annealed by using, for example, the RTA method at a temperature equal to or more than 500° C. and equal to or less than 650° C. The annealing process of the n-side contact electrode 38 lowers the contact resistance of the n-side contact electrode 38.

In the annealing process of the n-side contact electrode 38, the p-side electrode covering layer 32 is also concurrently annealed at a temperature equal to or more than 500° C. and equal to or less than 650° C. Therefore, the p-side electrode covering layer 32 is annealed at a temperature equal to or more than 500° C. and equal to or less than 650° C. after the dielectric covering layers (the first dielectric covering layer 34 and the second dielectric covering layer 36) are formed. The film density of the Rh layer 52 included in the p-side electrode covering layer 32 is slightly lowered by the annealing process and will be equal to or more than 11.5 g/cm$^3$ and equal to or less than 11.8 g/cm$^3$. When the Rh layer formed by sputtering at a temperature equal to or less than 100° C. is annealed at a temperature equal to or more than 500° C. and equal to or less than 650° C., the film density of the annealed Rh layer will be less than 12 g/cm$^3$.

Figure 9:
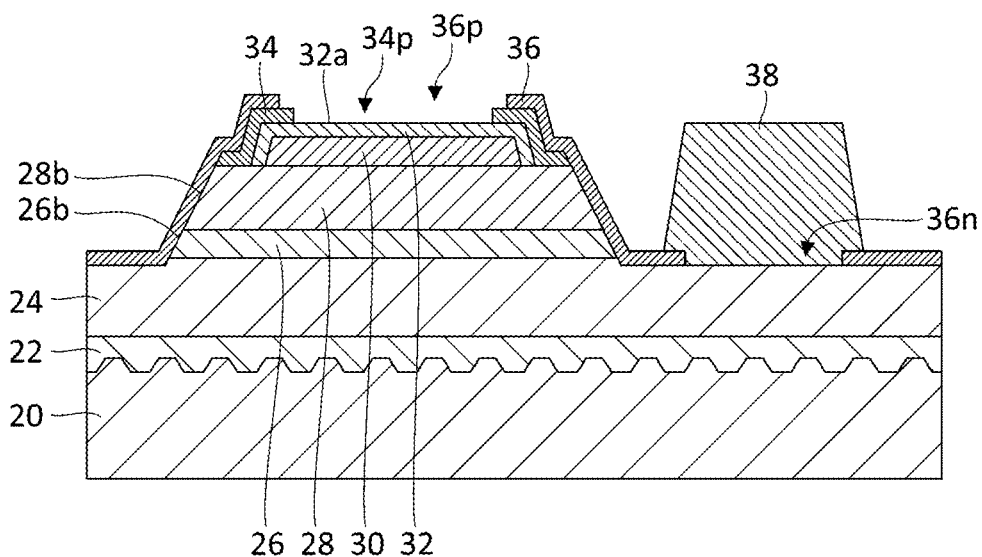
FIG. 9 schematically shows a step of manufacturing the semiconductor light-emitting element.

Subsequently, as shown in FIG. 9, the first dielectric covering layer 34 is removed in part by dry-etching or the like by using, for example, a publicly known lithographic technology to form the first connection opening 34p. The first connection opening 34p is formed to extend through the first dielectric covering layer 34, and the upper surface 32a of the p-side electrode covering layer 32 is exposed in the first connection opening 34p.

Figure 10:
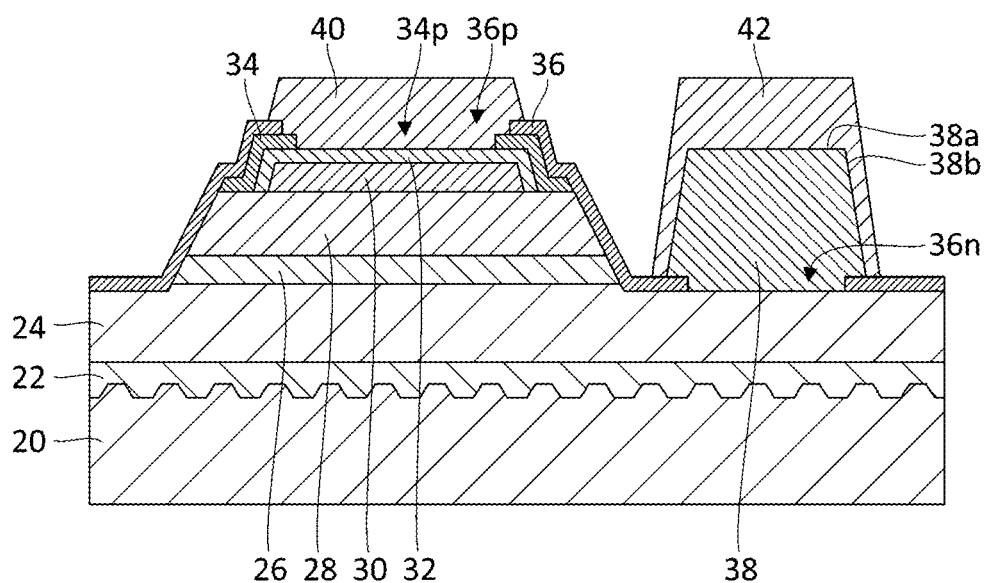
FIG. 10 schematically shows a step of manufacturing the semiconductor light-emitting element.

Subsequently, as shown in FIG. 10, the p-side current diffusion layer 40 connected to the p-side electrode covering layer 32 is formed in the connection openings (the first connection opening 34p and the second connection opening 36p) by using, for example, a publicly known lithographic technology, to form the n-side current diffusion layer 42 to cover the upper surface 38a and the side surface 38b of the n-side contact electrode 38. The p-side current diffusion layer 40 and the n-side current diffusion layer 42 can be formed simultaneously by sputtering. As shown in FIGS. 2 and 3, the first TiN layers 56, 74 are formed first, and then the multilayer metal films 58, 76 including the Ti layers 58a, 76a and the Rh layers 58b, 76b are formed on the first TiN layers 56, 74, and the second TiN layers 60, 78 are formed on the multilayer metal films 58, 76. The Ti layers 62, 80 and the Au layers 64, 82 may further be formed on the second TiN layers 60, 78. The film density of the Rh layer formed by sputtering at a temperature equal to or less than 100° C. is less than 12 g/cm$^3$ and is, for example, equal to or more than 11.6 g/cm$^3$ and equal to or less than 11.9 g/cm$^3$. The p-side current diffusion layer 40 and the n-side current diffusion layer 42 may be formed separately.

Figure 11:
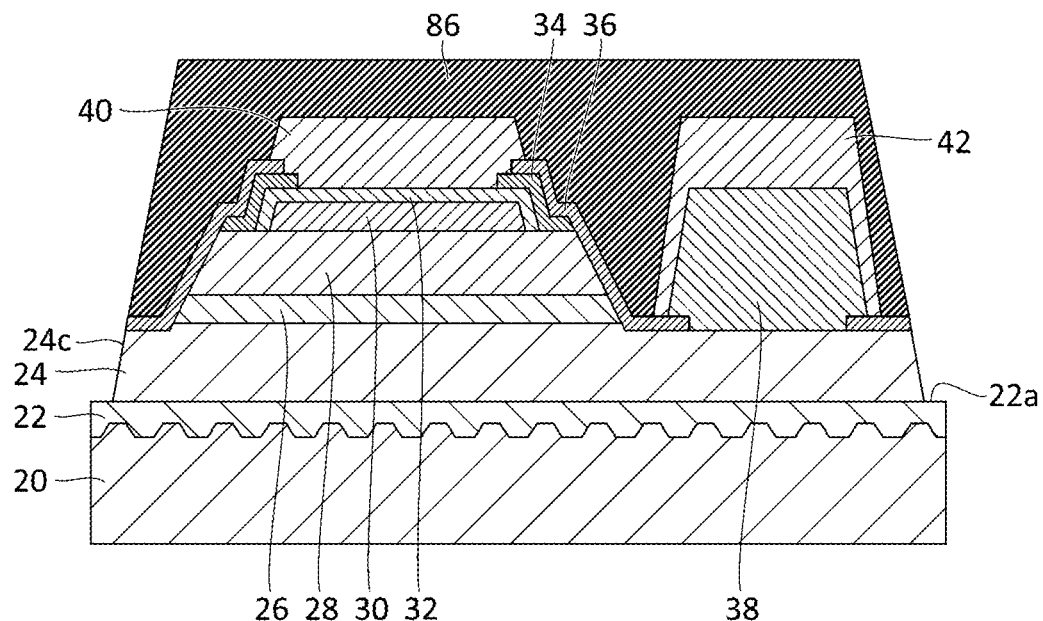
FIG. 11 schematically shows a step of manufacturing the semiconductor light-emitting element.

Subsequently, as shown in FIG. 11, a mask 86 is formed on the second dielectric covering layer 36, the p-side current diffusion layer 40, and the n-side current diffusion layer 42 by using, for example, a publicly known lithographic technology. After the mask 86 is formed, the second dielectric covering layer 36 and the n-type semiconductor layer 24 in a region not overlapping the mask 86 are removed by dry-etching or the like to expose the upper surface 22a of the base layer 22. This etching step forms the side surface 24c of the n-type semiconductor layer 24. The mask 86 is then removed.

Figure 12:
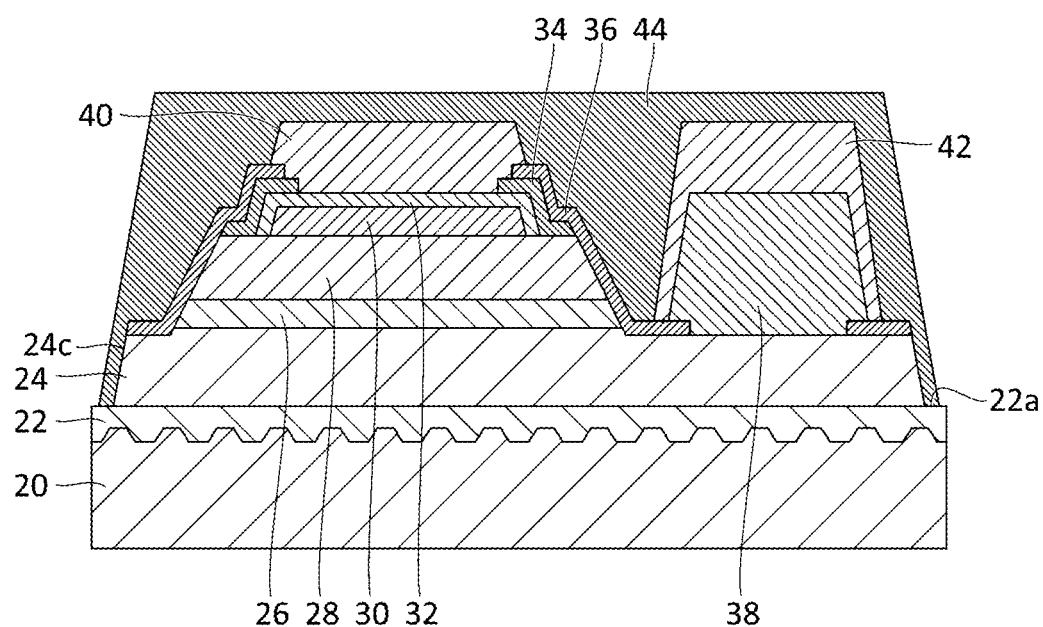
FIG. 12 schematically shows a step of manufacturing the semiconductor light-emitting element.

Subsequently, as shown in FIG. 12, the dielectric protective layer 44 is formed. The dielectric protective layer 44 is provided to be directly in contact with and to cover the upper surface 22a of base layer 22, the side surface 24c of the n-type semiconductor layer 24, the second dielectric covering layer 36, the p-side current diffusion layer 40, and the n-side current diffusion layer 42. The dielectric protective layer 44 is made of, for example, SiO$_2$ and can be formed by the PECVD method. The dielectric protective layer 44 is formed at a temperature equal to or more than 200° C. and equal to or less than 400° C.

In the step of forming the dielectric protective layer 44, the p-side current diffusion layer 40 and the n-side current diffusion layer 42 are heated at a temperature equal to or more than 200° C. and equal to or less than 400° C. The film density of the Rh layers 58b, 76b included in the p-side current diffusion layer 40 and the n-side current diffusion layer 42 is increased to be equal to or more than 12 g/cm$^3$ by heating the p-side current diffusion layer 40 and the n-side current diffusion layer 42 at a temperature equal to or more than 200° C. and equal to or less than 400° C. The film density of the Rh layer formed by sputtering at a temperature equal to or less than 100° C. is less than 12 g/cm$^3$ and is, for example, equal to or more than 11.6 g/cm$^3$ and equal to or less than 11.9 g/cm$^3$. Meanwhile, the film density of the Rh layer heated at a temperature equal to or more than 200° C. and equal to or less than 400° C. will be, for example, equal to or more than 12.2 g/cm$^3$ and equal to or less than 12.5 g/cm$^3$.

Subsequently, as shown in FIG. 1, the dielectric protective layer 44 is removed in part by dry-etching or the like to form the p-side pad opening 44p and the n-side pad opening 44n. The p-side pad opening 44p and the n-side pad opening 44n are formed to extend through the dielectric protective layer 44. The p-side current diffusion layer 40 is exposed in the p-side pad opening 44p, and the n-side current diffusion layer 42 is exposed in the n-side pad opening 44n. Subsequently, the p-side pad electrode 46 connected to the p-side current diffusion layer 40 in the p-side pad opening 44p is formed to block the p-side pad opening 44p, and the n-side pad electrode 48 connected to the n-side current diffusion layer 42 in the n-side pad opening 44n is formed to block the n-side pad opening 44n. The p-side pad electrode 46 and the n-side pad electrode 48 may be formed simultaneously but may be formed separately.

The semiconductor light-emitting element 10 shown in FIG. 1 is completed through the steps described above.

According to the embodiment, adhesion of the first dielectric covering layer 34 to the p-side contact electrode 30 can be improved by covering the upper surface 30a and the side surface 30b of the p-side contact electrode 30, which includes the Rh layer, and forming the first dielectric covering layer 34 to be in contact with the upper surface 32a and the side surface 32b of the p-side electrode covering layer 32.

According to the embodiment, the Rh layer included in the p-side electrode covering layer 32 can be used as an etching stop layer when the first connection opening 34p is formed in the first dielectric covering layer 34. This prevents a damage to the Rh layer included in the p-side contact electrode 30 and prevents the reflective characteristics of the p-side contact electrode 30 from being lowered.

According to the embodiment, it is possible to disperse a current in the p-side electrode covering layer 32, too, by configuring the p-side electrode covering layer 32 to have a Ti/Rh/TiN stack structure. In other words, a high electric current traveling toward the p-side contact electrode 30 can be dispersed both in the p-side electrode covering layer 32 and the p-side current diffusion layer 40 so that local current concentration can be suppressed.

According to the embodiment, the film density of the Rh layer included in the p-side contact electrode 30 is larger than the film density of the Rh layer 52 included in the p-side electrode covering layer 32 so that the Rh layer included in the p-side contact electrode 30 can be configured to be dense to increase the reflectivity for ultraviolet light. This allows the p-side contact electrode 30 to function as a highly efficient reflection electrode.

According to the embodiment, inclusion of the Rh layer 58b in the p-side current diffusion layer 40 can increase the quality of sealing in the connection openings (the first connection opening 34p and the second connection opening 36p) in which the dielectric covering layers (the first dielectric covering layer 34 and the second dielectric covering layer 36) are removed so that the moisture resistance of the semiconductor light-emitting element 10 can be improved. Similarly, inclusion of the Rh layer 76b in the n-side current diffusion layer 42 can increase the quality of sealing of the n-side contact electrode 38 and suppress degradation of the Al layer 68 included in the n-side contact electrode 38. Further, the film density of the Rh layers 58b, 76b included in the p-side current diffusion layer 40 and the n-side current diffusion layer 42 is larger than the film density of the Rh layer 52 included in the p-side electrode covering layer 32 so that the Rh layers 58b, 76b included in the p-side current diffusion layer 40 and the n-side current diffusion layer 42 can be configured to be dense to increase the quality of sealing even further.

According to the embodiment, formation of the Rh layer included in the p-side contact electrode 30 by deposition can suppress the damage done to the upper surface 28a of the p-type semiconductor layer 28 when the Rh layer is formed and lower and the contact resistance of the p-side contact electrode 30 more successfully than sputtering. Meanwhile, formation of the Rh layer 52 included in the p-side electrode covering layer 32 by sputtering can increase adhesion to the p-side contact electrode 30 and suppress exfoliation of the p-side electrode covering layer 32 more successfully than deposition.

According to the embodiment, annealing the p-side contact electrode 30 at a temperature equal to or more than 500° C. and equal to or less than 650° C. can lower the contact resistance of the p-side contact electrode 30 and improve the film density of the Rh layer included in the p-side contact electrode 30 as compared to the levels before the annealing. Further, annealing the p-side electrode covering layer 32 at a temperature equal to or more than 500° C. and equal to or less than 650° C. after the first dielectric covering layer 34 is formed can improve adhesion of the p-side electrode covering layer 32 as compared to the level before the annealing. This can suppress exfoliation of the p-side electrode covering layer 32 and the first dielectric covering layer 34.

According to the embodiment, heating the p-side current diffusion layer 40 and the n-side current diffusion layer 42 at a temperature equal to or more than 200° C. and equal to or less than 200° C. can increase the film density of the Rh layers 58b, 76b included in the p-side current diffusion layer 40 and the n-side current diffusion layer 42 as compared to the level before the heating. This can increase the quality of sealing of the p-side current diffusion layer 40 and the n-side current diffusion layer 42.

Described above is an explanation based on an exemplary embodiment. The embodiment is intended to be illustrative only and it will be understood by those skilled in the art that various design changes are possible and various modifications are possible and that such modifications are also within the scope of the present invention.

A description will be given below of some aspects of the present invention.

A first aspect of the present invention relates to a semiconductor light-emitting element includes: an n-type semiconductor layer made of an n-type AlGaN-based semiconductor material; an active layer provided on the n-type semiconductor layer and made of an AlGaN-based semiconductor material; a p-type semiconductor layer provided on the active layer; a p-side contact electrode that includes a Rh layer in contact with an upper surface of the p-type semiconductor layer; a p-side electrode covering layer that is in contact with an upper surface and a side surface of the p-side contact electrode and includes a Ti layer, a Rh layer, and a TiN layer stacked successively; a dielectric covering layer that has a connection opening provided on the p-side electrode covering layer and covers the p-side electrode covering layer in a portion different from the connection opening; and a p-side current diffusion layer that connects to the p-side electrode covering layer in the connection opening. According to the first aspect, adhesion of the dielectric covering layer to the p-side contact electrode can be improved by covering the upper surface and the side surface of the p-side contact electrode, which includes the Rh layer, and forming the dielectric covering layer to cover the p-side electrode covering layer.

A second aspect of the present invention relates to the semiconductor light-emitting element according to the first aspect, wherein a film density of the Rh layer included in the p-side contact electrode is larger than a film density of the Rh layer included in the p-side electrode covering layer. According to the second aspect, the Rh layer included in the p-side contact electrode can be configured to be dense to increase the reflectivity for ultraviolet light, and the p-side contact electrode 30 is allowed to function as a highly efficient reflection electrode.

A third aspect of the present invention relates to the semiconductor light-emitting element according to the first or second aspect, wherein the p-side current diffusion layer includes a TiN layer, a Ti layer, a Rh layer, and a TiN layer stacked successively, and a film density of the Rh layer included in the p-side current diffusion layer is larger than a film density of the Rh layer included in the p-side electrode covering layer. According to the third aspect, inclusion of the Rh layer in the p-side current diffusion layer can increase the quality of sealing in the connection openings in which the dielectric covering layers are removed so that the moisture resistance of the semiconductor light-emitting element can be improved. Further, the Rh layer included in the p-side current diffusion layer can be configured to be dense to increase the quality of sealing even further.

A fourth aspect of the present invention relates to a method of manufacturing a semiconductor light-emitting element, including: forming an active layer made of an AlGaN-based semiconductor material on an n-type semiconductor layer made of an n-type AlGaN-based semiconductor material; forming a p-type semiconductor layer on the active layer; forming a p-side contact electrode that includes a Rh layer in contact with an upper surface of the p-type semiconductor layer; forming a p-side electrode covering layer in contact with an upper surface and a side surface of the p-side contact electrode and including a Ti layer, a Rh layer, and a TiN layer stacked successively; forming a dielectric covering layer that covers an upper surface and a side surface of the p-side electrode covering layer; removing the dielectric covering layer on the p-side electrode covering layer to form a connection opening in which the p-side electrode covering layer is exposed; and forming a p-side current diffusion layer that connects to the p-side electrode covering layer in the connection opening, wherein the Rh layer included in the p-side contact electrode is formed by deposition, and the Rh layer included in the p-side current diffusion layer is formed by sputtering. According to the fourth aspect, formation of the Rh layer included in the p-side contact electrode by deposition can suppress the damage done to the upper surface of the p-type semiconductor layer when the Rh layer is formed and lower the contact resistance of the p-side contact electrode more successfully than sputtering. Meanwhile, formation of the Rh layer included in the p-side electrode covering layer by sputtering can increase adhesion to the p-side contact electrode and suppress exfoliation of the p-side electrode covering layer more successfully than deposition.

A fifth aspect of the present invention relates to the method of manufacturing a semiconductor light-emitting element according to the fourth aspect, further including: annealing the p-side contact electrode at a temperature equal to or more than 500° C. and equal to or less than 650° C. before the p-side electrode covering layer is formed; and annealing the p-side electrode covering layer at a temperature equal to or more than 500° C. and equal to or less than 650° C. after the dielectric covering layer is formed. According to the fifth aspect, annealing the p-side contact electrode at a temperature equal to or more than 500° C. and equal to or less than 650° C. can lower the contact resistance of the p-side contact electrode and improve the film density of the p-side contact electrode as compared to the levels before annealing. Further, annealing the p-side electrode covering layer at a temperature equal to or more than 500° C. and equal to or less than 650° C. after the first dielectric covering layer is formed can improve adhesion of the p-side electrode covering layer as compared to the level before annealing.

A sixth aspect of the present invention relates to the method of manufacturing a semiconductor light-emitting element according to the fifth aspect, wherein the p-side current diffusion layer includes a TiN layer, a Rh layer, and a TiN layer stacked successively, and the Rh layer included in the p-side current diffusion layer is formed by sputtering, the method further comprising: heating the p-side current diffusion layer at a temperature equal to or more than 200° C. and equal to or less than 200° C. According to the sixth aspect, heating the p-side current diffusion layer at a temperature equal to or more than 200° C. and equal to or less than 200° C. can increase the film density of the Rh layer included in the p-side current diffusion layer as compared to the level before the heating. This can increase the quality of sealing of the p-side current diffusion layer.

What is claimed is:

1. A semiconductor light-emitting element comprising:
    an n-type semiconductor layer made of an n-type AlGaN-based semiconductor material;
    an active layer provided on the n-type semiconductor layer and made of an AlGaN-based semiconductor material;
    a p-type semiconductor layer provided on the active layer;
    a p-side contact electrode that includes a Rh layer in contact with an upper surface of the p-type semiconductor layer;
    a p-side electrode covering layer that is in contact with an upper surface and a side surface of the p-side contact electrode and includes a Ti layer, a Rh layer, and a TiN layer stacked successively;
    a dielectric covering layer that has a connection opening provided on the p-side electrode covering layer and covers the p-side electrode covering layer in a portion different from the connection opening; and
    a p-side current diffusion layer that connects to the p-side electrode covering layer in the connection opening.

2. The semiconductor light-emitting element according to claim 1, wherein
    a film density of the Rh layer included in the p-side contact electrode is larger than a film density of the Rh layer included in the p-side electrode covering layer.

3. The semiconductor light-emitting element according to claim 1, wherein
    the p-side current diffusion layer includes a TiN layer, a Ti layer, a Rh layer, and a TiN layer stacked successively, and a film density of the Rh layer included in the p-side current diffusion layer is larger than a film density of the Rh layer included in the p-side electrode covering layer.

4. A method of manufacturing a semiconductor light-emitting element, comprising:
    forming an active layer made of an AlGaN-based semiconductor material on an n-type semiconductor layer made of an n-type AlGaN-based semiconductor material;
    forming a p-type semiconductor layer on the active layer;
    forming a p-side contact electrode that includes a Rh layer in contact with an upper surface of the p-type semiconductor layer;
    forming a p-side electrode covering layer in contact with an upper surface and a side surface of the p-side contact electrode and including a Ti layer, a Rh layer, and a TiN layer stacked successively;
    forming a dielectric covering layer that covers an upper surface and a side surface of the p-side electrode covering layer;
    removing the dielectric covering layer on the p-side electrode covering layer to form a connection opening in which the p-side electrode covering layer is exposed; and
    forming a p-side current diffusion layer that connects to the p-side electrode covering layer in the connection opening, wherein
    the Rh layer included in the p-side contact electrode is formed by deposition, and
    the Rh layer included in the p-side current diffusion layer is formed by sputtering.

5. The method of manufacturing a semiconductor light-emitting element according to claim 4, further comprising:
    annealing the p-side contact electrode at a temperature equal to or more than 500° C. and equal to or less than 650° C. before the p-side electrode covering layer is formed; and
    annealing the p-side electrode covering layer at a temperature equal to or more than 500° C. and equal to or less than 650° C. after the dielectric covering layer is formed.

6. The method of manufacturing a semiconductor light-emitting element according to claim 5, wherein
    the p-side current diffusion layer includes a TiN layer, a Rh layer, and a TiN layer stacked successively, and the Rh layer included in the p-side current diffusion layer is formed by sputtering,
    the method further comprising:
    heating the p-side current diffusion layer at a temperature equal to or more than 200° C. and equal to or less than 200° C.

* * * * *